United States Patent [19]

Matsumoto et al.

[11] Patent Number: 4,677,453
[45] Date of Patent: Jun. 30, 1987

[54] SOLID STATE IMAGE SENSOR

[75] Inventors: Kazuya Matsumoto; Tsutomu Nakamura, both of Ina, Japan

[73] Assignee: Olympus Optical Co., Ltd., Japan

[21] Appl. No.: 709,804

[22] Filed: Mar. 8, 1985

[30] Foreign Application Priority Data

Apr. 27, 1984 [JP] Japan .................. 59-85904

[51] Int. Cl.⁴ .................. H01L 27/14; H01L 31/00
[52] U.S. Cl. .................. 357/30; 357/22; 357/41; 357/45
[58] Field of Search .................. 357/23.1, 30, 22, 22 E, 357/32, 41, 45, 47

[56] References Cited

U.S. PATENT DOCUMENTS 4,364,167 12/1982 Donley .................. 357/45
4,377,817 3/1983 Nishizawa et al. .................. 357/22

FOREIGN PATENT DOCUMENTS

0088363 7/1981 Japan .................. 357/23.1
0054361 3/1982 Japan .................. 357/47

Primary Examiner—James W. Davie
Assistant Examiner—Georgia Y. Epps
Attorney, Agent, or Firm—Parkhurst & Oliff

[57] ABSTRACT

In a solid state image sensor including a plurality of light receiving elements in a matrix manner, each light receiving element is composed of a static induction transistor having a MOS gate construction formed on a surface of a semiconductor substrate and having a potential barrier formed in a vertical direction perpendicular to the semiconductor substrate surface. Therefore, a self-alignment process can be preferably applied to a formation of the solid state image sensor, so that the light receiving elements can be integrated in an easy and simple manner.

17 Claims, 49 Drawing Figures

SOLID STATE IMAGE SENSOR

BACKGROUND OF THE INVENTION

The present invention relates to a solid state image sensor utilizing a static induction transistor (hereinafter, abbreviated as SIT) as an image pick-up element.

As a conventional solid state image sensor for use in video camera, facsimile etc. there has been proposed a charge transfer device such as BBD, CCD etc. or a MOS transistor device. However, these solid state image sensors have various disadvantages such as charge leakage during the charge transferring operation and a low sensitivity of light detection.

Recently, in order to eliminate the disadvantages mentioned above, there has been proposed a solid state image sensor comprising SITs. The SIT is a kind of phototransistor having both a photo-electrical converting function and a photoelectric charge storing function, and has various advantages such as high input impedance, high speed property, unsaturated property, low noise, low consumed power etc., as compared with a field effect transistor or a junction transistor. Therefore, if use is made of the SIT as a solid state image pick-up element, it is possible to form a solid state image sensor having high sensitivity, high speed response and wide dynamic range.

Such image sensor has been disclosed in the Japanese Patent Laid-Open Publication No. 105,672/83 published on June 23, 1983.

Figure 1:
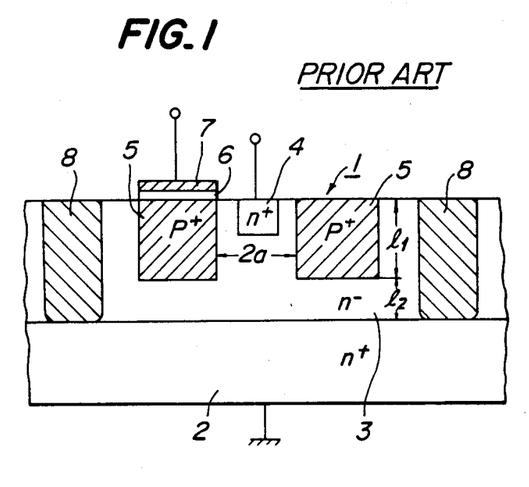
FIG. 1 is a cross sectional view showing a known SIT.

FIG. 1 is a cross sectional view showing one embodiment of the SIT consisting of one pixel of the known solid state image sensor. In this embodiment, an SIT 1 has a vertical type construction in which a drain region is constructed by an n+ substrate 2 and a source region is constructed by an n+ region 4 formed in an n− epitaxial layer 3 which is formed on the n+ substrate 2 and constitute a channel region. In the epitaxial layer 3 there is further formed a P+ signal storing gate region 5 surrounding the n+ source region 4, and on the gate region 5 is formed an electrode 7 via an insulating film 6. In this manner, a gate electrode is provided having a so-called MIS construction consisting of metal electrode/insulating film/semiconductor gate region. Moreover, the impurity concentration in the n− epitaxial layer 3 which constructs the channel region is set to such a low level that the channel region is depleted even if a bias applied to the gate electrode 7 is 0 V so that a pinch-off voltage due to a high potential barrier can be obtained.

Hereinafter, the operation of the SIT 1 mentioned above will be explained. When light is made incident upon the channel region 3 and the gate region 5 under the condition that a bias is not applied between the drain and source, holes of electron-hole pairs induced thereat are stored in the gate region 5 and electrons are discharged from the drain region 2 to the ground. The holes stored in the gate region 5 in response to the incident light function to increase a potential of the gate region 5 and to decrease the potential barrier of the channel region 3 in response to the incident light intensity. If the bias voltage is applied between the drain and source and also a foward bias voltage is applied to the gate electrode 7, a current flows between the drain and source in response to the amount of holes stored in the gate region 5 and thus the output amplified in accordance with the incident light intensity can be obtained. The light amplification S is described as follows, $$S \propto (l_1 \times l_2)/a^2$$

where $2a$ is an inner diameter of the ring-shaped gate region 5, $l_1$ is a depth of the gate region 5 and $l_2$ is a distance between the gate and drain regions. In the SIT 1 mentioned above, the value of the light amplification S is normally greater than $10^3$, and is higher by one order than that of a bipolar transistor. As can be seen from the above, in order to obtain a higher light amplification, it is necessary to make the distance $2a$ small and to make the depth of the epitaxial layer 3 and that of the gate region 5 large. For example, in order to obtain a light amplification S of $10^3$ to $10^4$, it is necessary to satisfy the condition that $l_1=2$ to 3 $\mu$m and $l_2=5$ to 6 $\mu$m.

In the solid state image sensor mentioned above, it is necessary to arrange an isolation region 8 between adjacent SITs so as to isolate the signal charges induced in respective SITs. This isolation is realized by a normal isolation method such as oxide film isolation, diffusion isolation or V-shape recess isolation. In this case, the isolation region 8 extends from a surface of the epitaxial layer 3 to the substrate 2, and thus it is difficult to form the isolation region 8 if the epitaxial layer 3 is thick. Moreover, as mentioned above, it is necessary to make the gate region 5 thick so as to increase the light amplification S, but this is not realized by the diffusion method. Further, if the gate region 5 is made thicker, the spectral sensitivity property becomes worse due to the absorption of light in the gate region 5. Therefore, in the known solid state image sensor consisting of vertical type SITs, the sensitivity is limited due to the construction thereof.

Moreover, in case of effecting a self-alignment process for integrating the source-gate construction, it is necessary to cover the source region 4 with a mask when the gate region 5 is formed. Therefore, the above process becomes complicated and expensive. Moreover, if the source-gate construction is integrated, a breakdown voltage between the source and drain becomes low so that the leak current might be increased to a great extent.

SUMMARY OF THE INVENTION

The present invention has for its object to remove the drawbacks mentioned above and to provide a solid state image sensor which can be integrated easily, realize a high sensitivity and can be formed in an inexpensive manner.

According to the invention, a solid state image sensor comprises:

a semiconductor substrate; and a plurality of pixels arranged in the semiconductor substrate in a matrix form, each of said pixels being formed by a static induction transistor having an insulated gate construction formed in the surface of semiconductor substrate and having a potential barrier in a direction perpendicular to the surface of semiconductor substrate.

DESCRIPTION OF THE PREFERRED EMBODIMENTS

Figure 2A:
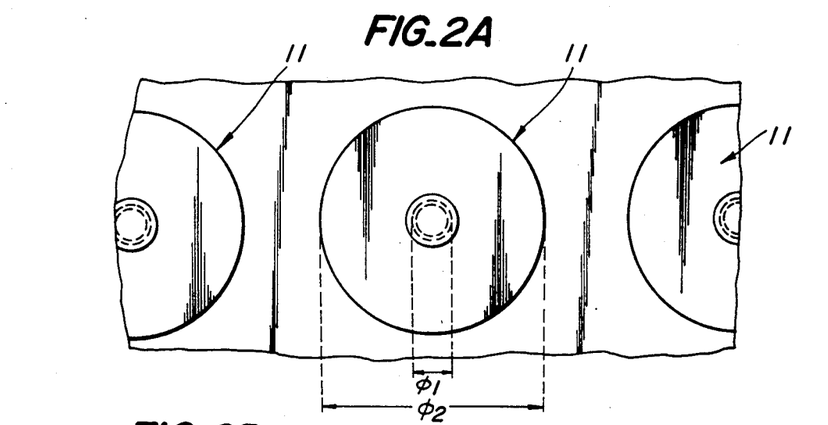
FIGS. 2A to 2C are schematic views showing one embodiment of a SIT consisting of the solid state image sensor according to the invention.
Figure 2B:
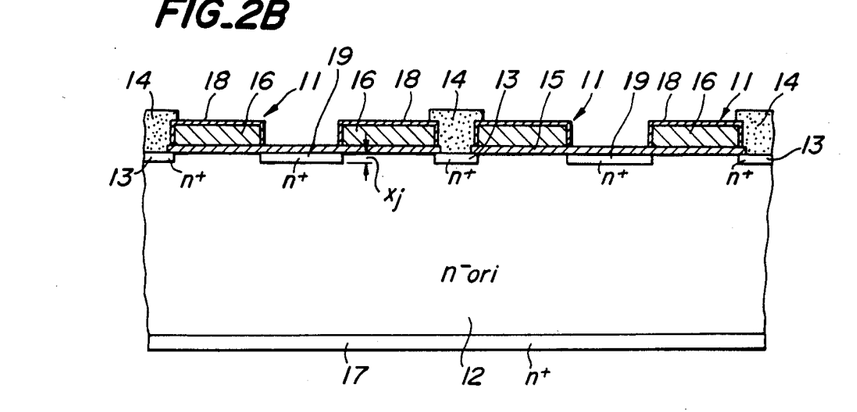

FIGS. 2A and 2B are plan and cross sectional views, respectively, showing one embodiment of a SIT constituting a pixel of the solid state image sensor according to the invention. In this embodiment, a SIT 11 comprises an $n^-$ or an intrinsic semiconductor substrate 12, a circular shaped $n^+$ source diffusion layer 13 formed in the surface of substrate 12, a source electrode 14 arranged on the source diffusion layer 13, a MOS gate construction consisting of a gate insulating film 15 arranged on the surface of the substrate 12 which surrounds the source diffusion layer 13, and a ring-shaped gate electrode 16 arranged on the gate insulating film 15 and made of polysilicon, $SnO_2$, ITO, and an $N^+$ drain diffusion layer 17 arranged on a rear surface of the substrate 12. Moreover, the gate electrode 16 is covered with an insulating film 18. Further, the gate insulating film 15 is uniformly arranged on the surface of the substrate 12 except a portion corresponding to the source diffusion layer 13 of respective SITs 11. There are further formed $n^+$ diffusion layers 19 between adjacent SITs 11 so as to electrically and optically isolate respective SITs 11.

In the SIT 11 having the MOS gate construction shown in FIGS. 2A and 2B (hereinafter, abbreviated as MOSSIT), a concentration of the substrate 12 made of $n^-$ semiconductor is preferably made below $1 \times 10^{13}$ $cm^{-3}$, and depths $x_j$ of the source diffusion layer 13 and the diffusion layer 19 for isolation are made to the substantially same value preferably below 0.2 $\mu$m. Moreover, a diameter $\phi_1$ of the source diffusion layer 13 is made preferably below 1.0 $\mu$m, an outer diameter $\phi_2$ of the gate electrode 16 is made to a value from 2.0 to 6.0 $\mu$m and also a thickness of the gate insulating layer 15 is made to a value from 200 to 1,000 Å.

Figure 2C:
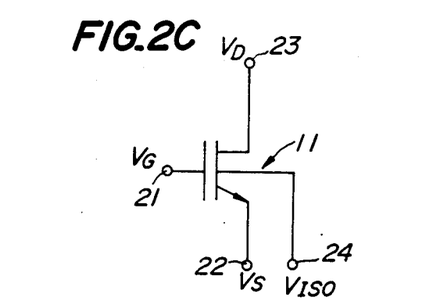
Figure 3A:
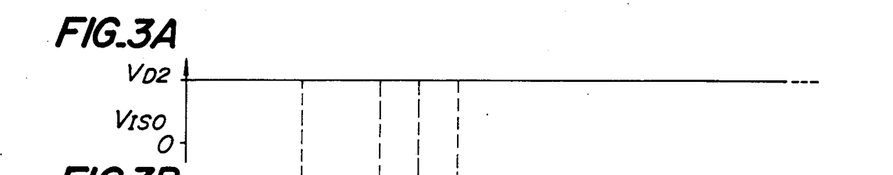
FIGS. 3A to 3D and FIGS. 4A to 4D are schematic views for explaining the operation of the SIT shown in FIGS. 2A to 2C.
Figures 3B, 3C:
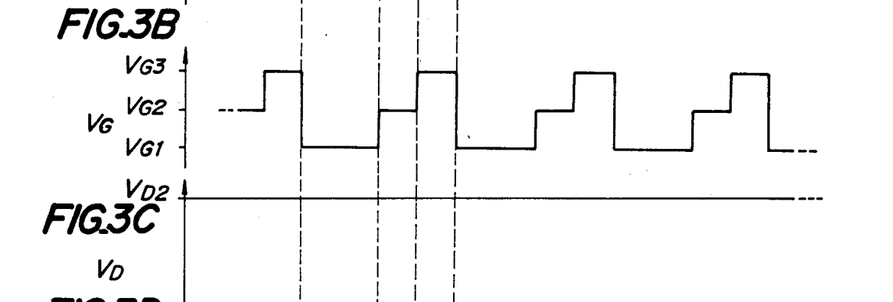
Figure 3D:
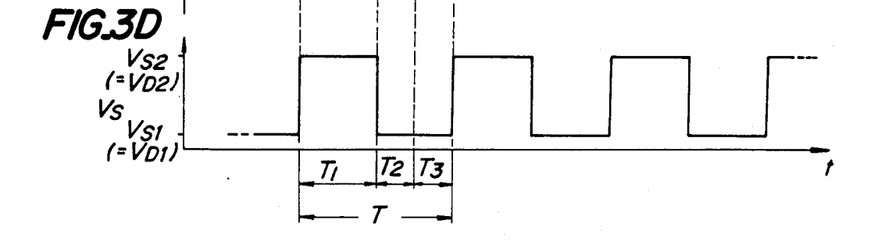

FIG. 2C shows an equivalent circuit of the MOSSIT 11, wherein a gate voltage $V_G$ is applied to the gate electrode 16 through a gate terminal 21, a source voltage $V_S$ is applied to the source electrode 14 through a source terminal 22, a drain voltage $V_D$ is applied to a drain terminal 23 which is further connected to the drain diffusion layer 17, and an isolation voltage $V_{ISO}$ is applied to an isolation terminal 24 which is further connected to the diffusion layers 19 for isolation.

Next, the operation of the MOSSIT 11 mentioned above will be explained with reference to FIGS. 3A to 3D and FIGS. 4A to 4D. FIGS. 3A to 3D are waveforms illustrating the isolation voltage $V_{ISO}$, the gate voltage $V_G$, the drain voltage $V_D$ and the source voltage $V_S$, respectively, in which the horizontal axis denotes a time t and the vertical axis represents a voltage value. A unit light receiving period T of the MOSSIT 11 is the sum of a storing time $T_1$, a readout time $T_2$ and a reset time $T_3$, during which the isolation voltage $V_{ISO}$ and the drain voltage $V_D$ are maintained at a constant voltage $V_{D2}(>0)$. During the storing time $T_1$, the gate voltage $V_G$ is maintained at a storing gate voltage $V_{G1}(<0)$ and the source voltage $V_S$ is kept at a voltage $V_{S2}(=V_{D2})$ equal to the drain voltage $V_D$. During the readout time $T_2$, the gate voltage $V_G$ is maintained at a readout gate voltage $V_{G2}$ ($V_{G1}<V_{G2}<0$) and the source voltage $V_S$ is kept at the ground voltage $V_{S1}$ ($<V_{S2}$). Further, during the reset time $T_3$, the gate voltage $V_G$ is maintained at a reset gate voltage $V_{G3}(>0)$ and the source voltage $V_S$ is kept also at the ground voltage $V_{S1}$.

Figure 4A:
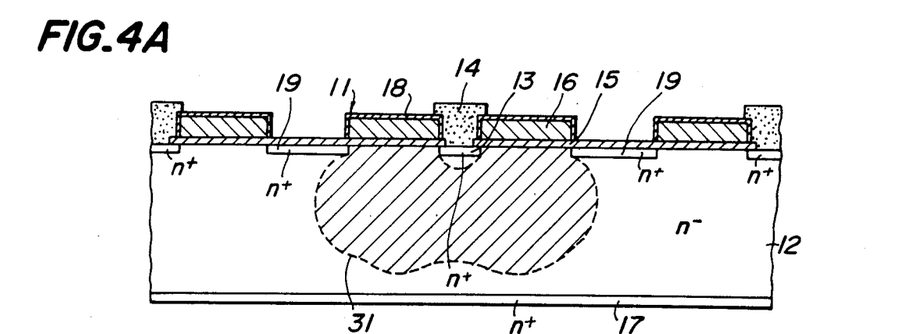
Figure 4B:
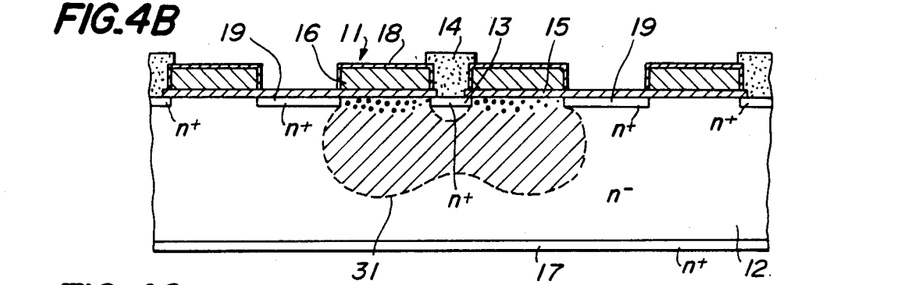

As shown in FIG. 4A, just after the reset operation, a depletion layer 31 extends into the substrate direction from a boundary between the gate insulating film 15 and the substrate 12. This extension of the depletion layer 31 is maintained until the readout time $T_2$ is started when light is not made incident upon the gate electrode 16. However, when light is made incident upon the gate electrode 16, electron-hole pairs are generated in the depletion layer 31. The thus generated holes are stored in the surface of the substrate 12 just beneath the gate insulating film 15 as shown in FIG. 4B, so that the extension of the depletion layer is decreased and thus the potential barrier with respect to the electron moving in the vertical direction is lowered as compared with the situation shown in FIG. 4A.

Figure 4C:
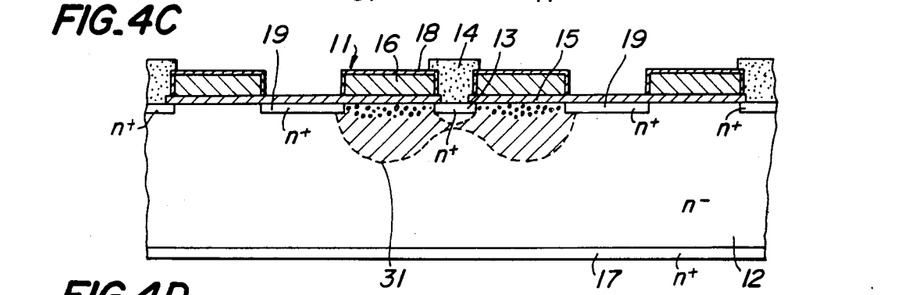

When the gate voltage $V_G$ is increased from $V_{G1}$ to $V_{G2}$ after a lapse of storing time $T_1$, the potential barrier with respect to the electron is further lowered in response to an increased amount of the gate voltage $V_G$ as shown in FIG. 4C, so that an amplified signal current flows between the source and drain. In this case, it is experimentally found that this output current is approximately in proportion to an integrated amount of incident light during the storing time $T_1$.

Figure 4D:
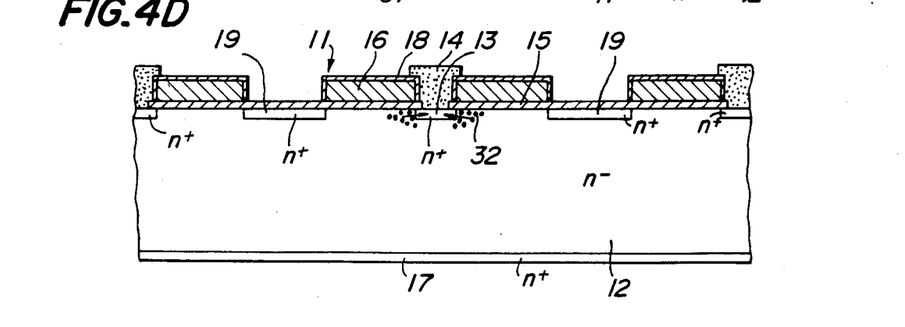

When the gate voltage $V_G$ is further increased from $V_{G2}$ to $V_{G3}$ ($>V_{S1}$) after a lapse of the readout time $T_2$, the holes 32 stored in the surface of the substrate 12 immediately below the gate insulating layer 15 are discharged through the source diffusion layer 13 and the source electrode 14 as shown in FIG. 4D. After that, when the gate voltage $V_G$ and the source voltage $V_S$ become $V_{G1}$ and $V_{S2}$, respectively, after a lapse of this reset time $T_3$, the next light receiving cycle is started. It should be noted that a movement of the holes 32 stored just beneath the gate insulating film 15 into adjacent pixels is avoided due to the fact that when the isolation voltage is applied to the diffusion layer 19, there is formed a high barrier for holes moving in the horizontal direction.

Figure 5A:
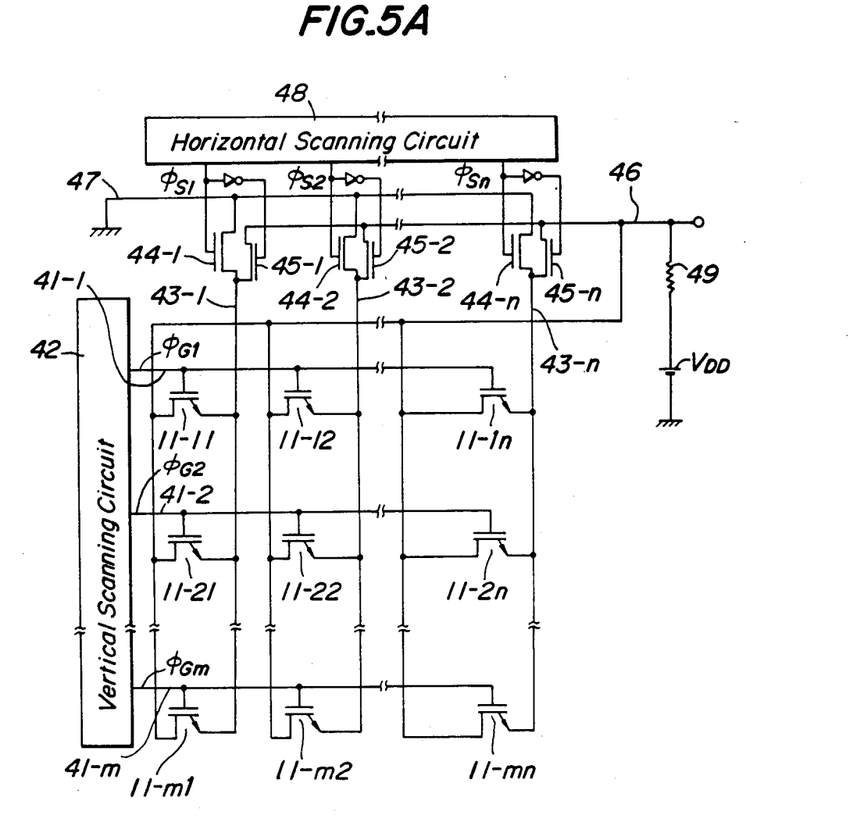
FIGS. 5A and 5B are schematic views for explaining circuit constructions and the operation of the entire solid state image sensor according to the invention.
Figure 5B:
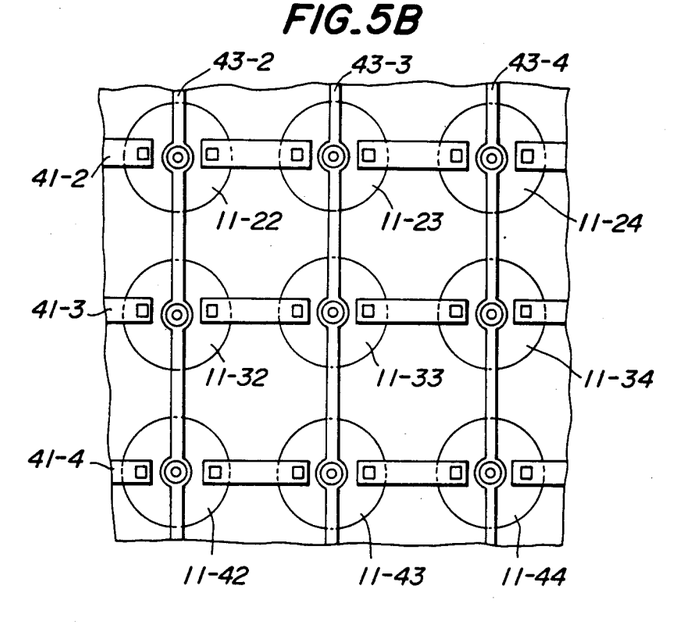

FIG. 5A is a circuit diagram showing one embodiment of the solid state image sensor according to the invention which utilizes MOSSITs illustrated in FIGS. 2A to 2C. Moreover, FIG. 5B is a plan view illustrating a part of the image sensor shown in FIG. 5A. In the present embodiment, $m \times n$ MOSSITs 11-11 to 11-$mn$ are arranged in a matrix form and image signals are successively readout from pixels by the XY address method i.e. a source-gate selecting method. To gate terminals of respective MOSSIT rows 11-11 to 11-$m$1, . . . , 11-1$n$ to 11-$mn$ arranged in the X direction are connected respective row lines 41-1, . . . , 41-$m$, and vertical scanning signals $\phi_{G1}, \ldots, \phi_{Gm}$ are supplied to those row lines 41-1, . . . , 41-$m$ respectively from a vertical scanning circuit 42. Moreover, to source terminals of respective MOSSIT columns 11-11 to 11-$m$1, . . . , 11-1$n$ to 11-$mn$ arranged in the Y direction are connected respective column lines 43-1, . . . , 43-$n$, and these column lines are respectively connected to a ground line 47 and a video line 46 through column selection transistors 44-1, . . . , 44-$n$ and inverse selection transistors 45-1, . . . , 45-$n$, respectively. Under such construction, horizontal scanning signals $\phi_{S1} \ldots, \phi_{Sn}$ are respectively supplied to the gate terminals of the column selection transistors 44-1, . . . , 44-$n$ from a horizontal scanning circuit 48, and also inversion signals of these horizontal signals are respectively supplied to gate terminals of the inverse selection transistors 45-1, . . . , 45-$n$. Further, the drain terminals of all the MOSSITs 11-11 to 11-$mn$ each of which constructs a pixel, are commonly connected to the video line 46, and a video voltage $V_{DD}$ is applied to the drain terminals through a load resistor 49. Moreover, the same voltage as that of the $V_{DD}$ is applied also to the diffusion layers for isolation between adjacent pixels.

Figures 6A, 6B, 6C:
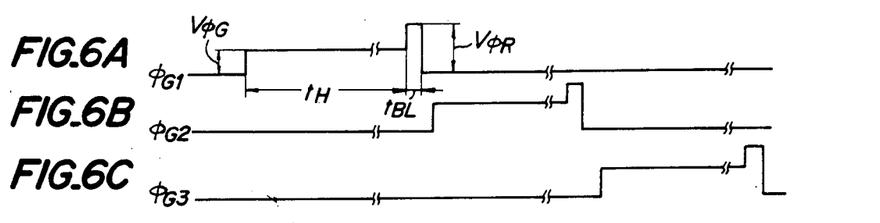
FIGS. 6A to 6F are waveforms showing vertical and horizontal scanning signals according to the invention.
Figures 6D, 6E:
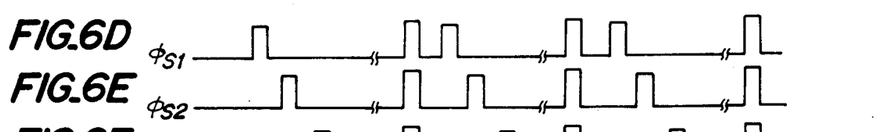
Figure 6F:
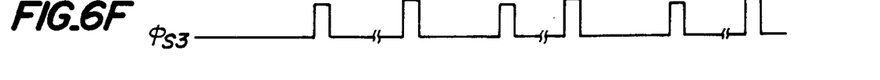

FIGS. 6A to 6C are waveforms showing vertical scanning signals $\phi_{G1}, \phi_{G2}$ . . . supplied to row lines 41-1, 41-2, . . . , and FIGS. 6D to 6F are waveforms illustrating horizontal scanning signals $\phi$S1, $\phi$S2 . . . supplied to the gate terminals of the column selection transistors 44-1, 44-2, . . . . The vertical scanning signals $\phi_{G1}, \phi_{G2}$ . . . each represented by a readout gate voltage $V_{\phi G}$ having a small amplitude and a reset voltage $V_{\phi R}$ having a large amplitude are set to $V_{\phi G}$ during one line scanning period $t_H$ and to $V_{\phi R}$ during a blanking period $t_{BL}$ until a horizontal scanning operation for the next line is started. Moreover, the horizontal scanning signals $\phi_{S1}, \phi_{S2}, \ldots$ function to select the column lines and are set to a voltage such that a low level signal makes the column selection transistors 44-1, 44-2, . . . cut-off and the inverse selection transistors 45-1, 45-2 . . conductive, and a high level signal makes the column selection transistors 44-1, 44-2, . . . conductive and the inverse selection transistors 45-1, 45-2, . . . non-conductive.

Next, the operation of the solid state image sensor illustrated in FIGS. 5A and 5B will be explained with reference to the waveforms shown in FIGS. 6A to 6F. When the signal $\phi_{G1}$ becomes the readout level $V_{\phi G}$ by the actuation of the vertical scanning circuit 42, a first MOSSIT row consisting of MOSSITs 11-11 to 11-1$n$ each connected to the row line 41-1 is selected, and then the column selection transistors 44-1 to 44-$n$ are made successively conductive by means of the signals $\phi_{S1}$ to $\phi$S$n$ supplied from the horizontal scanning circuit 48, so that the pixel signals of successive MOSSITs 11-11, 11-12, . . . 11-1$n$ are read out of the video line 46. Then, the MOSSIT row consisting of MOSSITs 11-11 to 11-1$n$ is reset by high level signals $\phi_{S1}$ to $\phi_{Sn}$ generated simultaneously when the signal $\phi_{G1}$ becomes the high level of $V_{\phi R}$. Moreover, when the signal $\phi_{G2}$ becomes the readout level $V_{\phi G}$, a second MOSSIT row consisting of MOSSITs 11-21 to 11-2$n$ each connected to the row line 41-2 is selected. Then, the pixel signals of the MOSSITs 11-21, 11-22 . . . 11-2$n$ are read out successively, and after that all the MOSSITs 11-21 to 11-2$n$ are reset at the same time. Hereinafter, successively pixel signals are read out in the same manner as mentioned above so as to obtain the video signals for one field.

In the embodiment mentioned above, since the source and drain of a non-selected SIT are mutually connected by the inverse selection transistors 45-1 to 45-$n$, no signal (non-selection signal) is generated from the non-selected MOSSIT.

In the solid state image sensor illustrated in FIG. 5A, a light receiving device comprising the MOSSITs 11-11 to 11-$mn$ each representing one pixel and peripheral circuit devices such as the vertical scanning circuit 42 for driving the light receiving device, the column selection transistors 44-1 to 44-$n$, the inverse selection transistors 45-1 to 45-$n$ and the horizontal scanning circuit 48 are formed on the same substrate.

Hereinafter, successive steps of the process for manufacturing these light receiving devices and peripheral circuit devices will be explained with reference to FIGS. 7A to 7H.

Figure 7A:
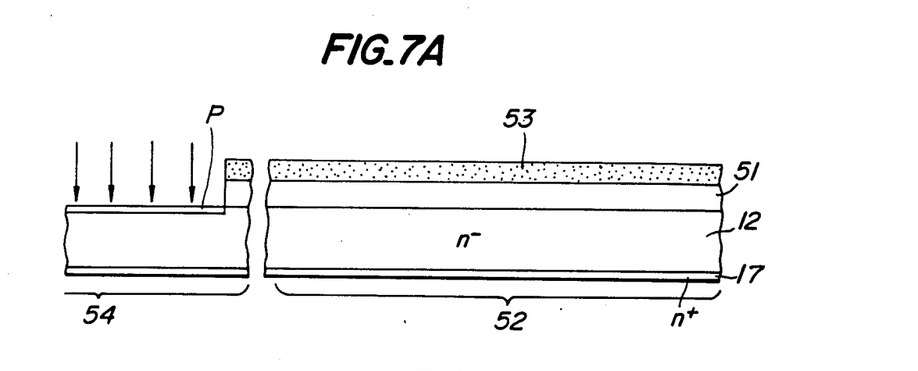
FIGS. 7A to 7H are schematic views showing a process of manufacturing the solid state image sensor illustrated in FIG. 5A.
Figure 7B:
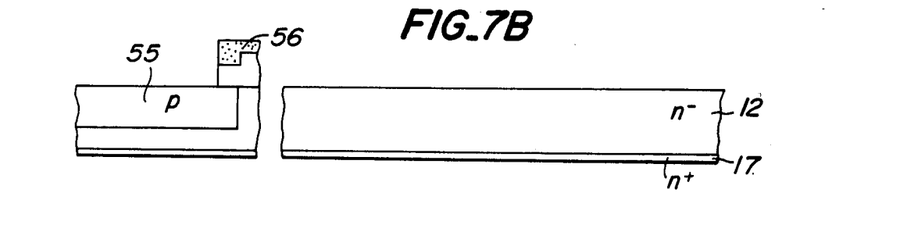
Figure 7C:
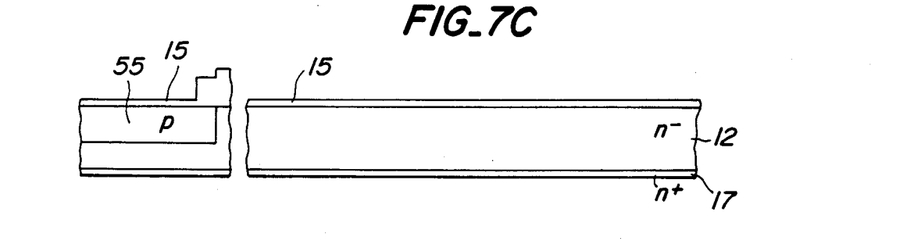

At first, as shown in FIG. 7A, a field insulating film 51 having a thickness of about 7,000 Å is formed uniformly on the surface of the wafer substrate 12 by means of thermal oxidation, etc. After that, a resist film 53 is formed on a light receiving device portion 52 by means of photolithography and then an insulating film corresponding to a portion in which a well for the peripheral circuit device portion 54 is to be formed is etched away so as to deposit an acceptor impurity such as boron having a concentration of about $1 \times 10^{13}$ cm$^{-2}$ in this region. Then, an n$^+$ drain layer 17 of the light receiving device is formed on a rear surface of the substrate 12, and after that the resist film 53 for the well formation is removed, and a well 55 having a thickness of about 5 $\mu$m is formed by a well drive-in as shown in FIG. 7B. Then, an insulating film corresponding to a portion to which a gate insulating film is to be formed is removed by an etching operation after a resist film 56 is formed on the region other than the etched region by photolithograph, so that the gate insulating film 15 having a thickness of about 200 to 1,000 Å is formed as shown in FIG. 7C.

Figure 7D:
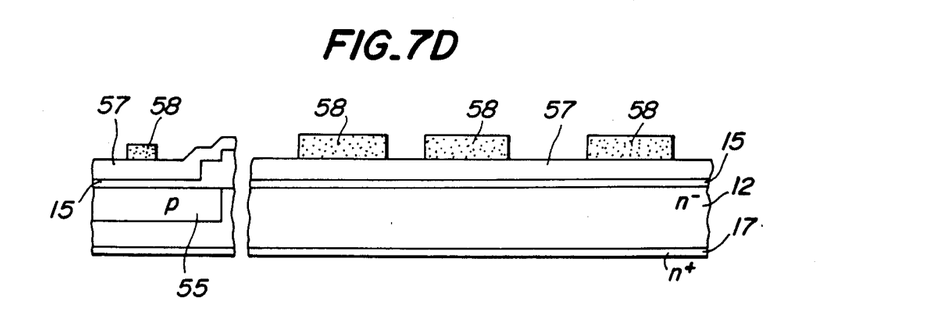
Figure 7E:
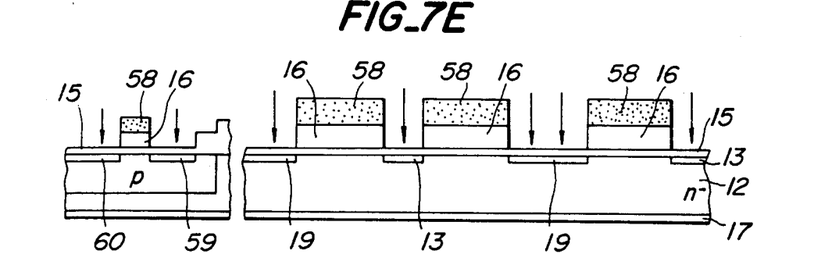

Next, as shown in FIG. 7D, an electrode film 57 having a thickness of about 500 to 3,000 Å is formed to construct the gate electrode, and a resist film 58 which constructs the gate electrode of the MOSSIT in the light receiving device and NMOSFET in the peripheral circuit devices is formed on the electrode film 57 by photolithography. After that, as shown in FIG. 7E, the electrode film 57 is selectively removed by an etching operation to form the gate electrodes 16 of the MOSSITs and NMOSFETs, and then by utilizing the gate electrodes 16 as a mask the n$^+$ source diffusion layers 13 and the n$^+$ diffusion layers 19 for isolation of MOSSITs and n$^+$ source diffusion layers 59 and n$^+$ drain diffusion layers 60 of NMOSFETs are formed by an ion injection method in such a manner that arsenic or phosphorus is deposited in the substrate 12 at a concentration of about $1 \times 10^{15}$ to $10 \times 10^{15}$ cm$^{-2}$.

Figure 7F:
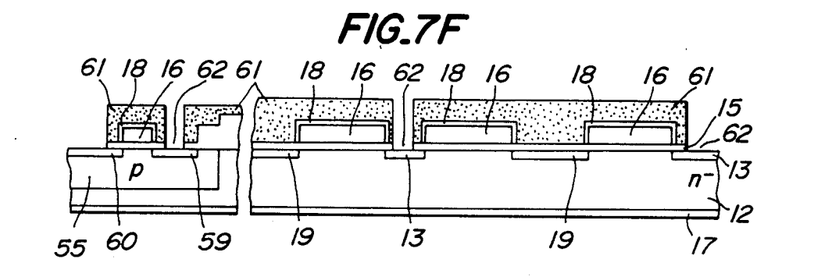
Figure 7G:
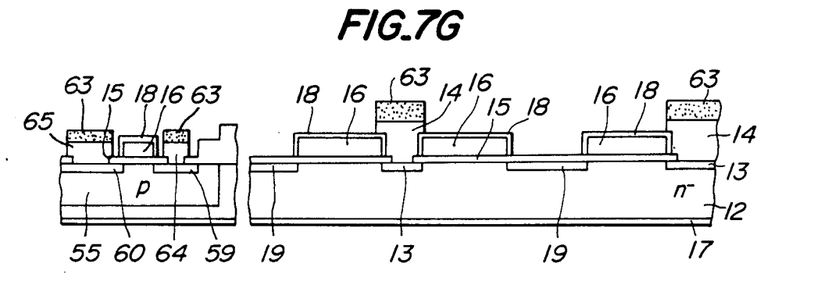
Figure 7H:
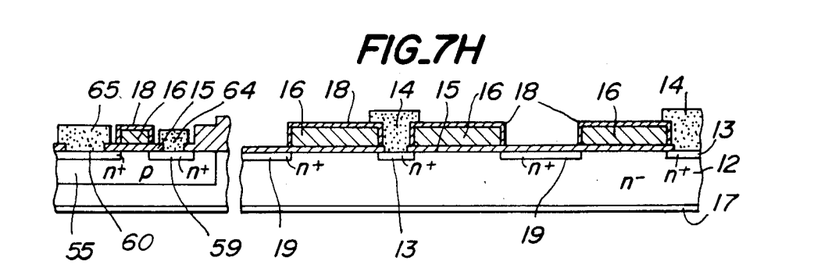

After that, the resist film 58 for use in the gate electrode formation is removed and the insulating film 18 is formed on the surface of the gate electrode 16. Then, as shown in FIG. 7F, a resist film 61 is formed by photolithography and in the resist film 61 is formed contact holes 62 for forming respectively the source electrodes and the electrodes for isolation of the light receiving device and the source electrodes and the drain electrodes of NMOSFETs which construct the peripheral circuit devices. Then, the resist film 61 for use in contact hole formation is removed and the source electrodes and the electrodes for isolation of the light receiving device and the source electrodes and the drain electrodes of NMOSFETs of the peripheral circuit devices are formed. Then, as shown in FIG. 7G, a resist film 63 is formed by photolithography and a residual electrode film is removed by etching so as to form respectively the source electrodes 14 and the electrode for isolation (not shown) of the light receiving device and source electrodes 64 and drain electrodes 65 of NMOSFETs of the peripheral circuit devices. After that, the resist film 63 on the these electrodes is removed as shown in FIG. 7H, and the light receiving device having MOSSITs and the peripheral circuit devices having NMOSFETs are formed on the same substrate 12.

In this manner, according to the invention, the light receiving devices and the peripheral circuit devices can be formed on the same substrate by utilizing few masks, such as five or six, and thus these devices can be made simply and inexpensively. Particularly, since the self-alignment can be effected, devices of very small size can be formed precisely.

Figure 8A:
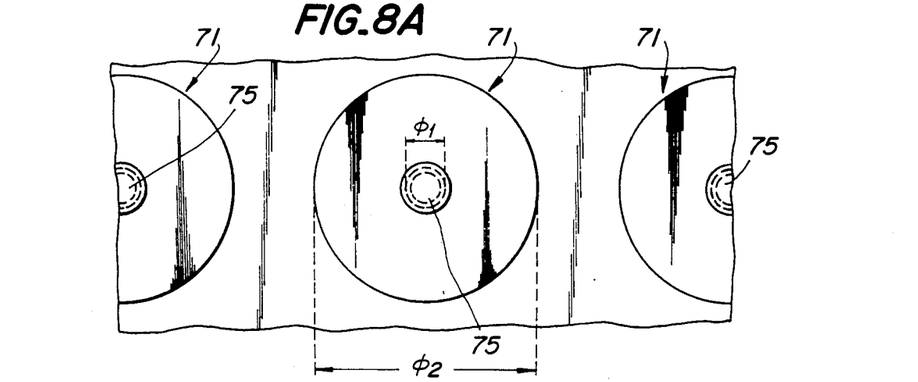
FIGS. 8A to 8C are schematic views illustrating one embodiment of the SIT forming the solid state image sensor according to the invention.
Figure 8B:
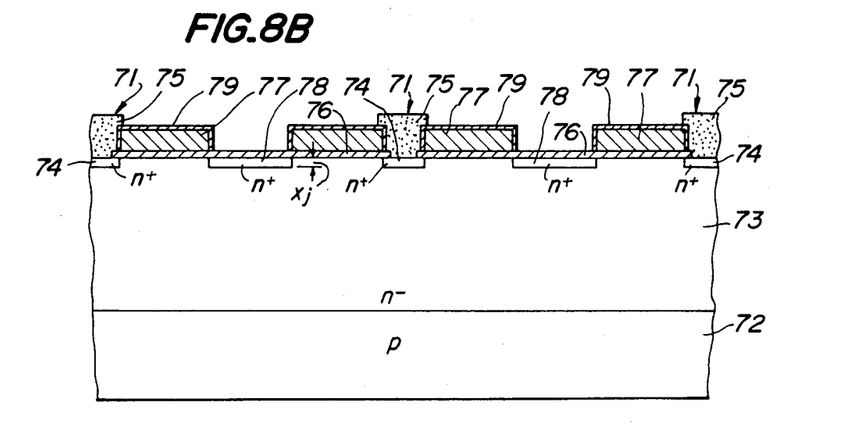

FIGS. 8A and 8B are plan and cross sectional views, respectively, showing another embodiment of the solid state image sensor having MOSSITs each constituting respective pixels. A MOSSIT 71 has a double-layer construction such that an epitaxial layer 73 of $n^-$ or intrinsic semiconductor is deposited on a surface of a substrate 72, and comprises a circular-shaped $n^+$ source diffusion layer 74 formed in the surface of the epitaxial layer 73, a source electrode 75 arranged on the source diffusion layer 74, a MOS gate construction consisting of a gate insulating film 76 arranged on the epitaxial layer 73 which surrounds the source diffusion layer 74 and a ring-shaped gate electrode 77 made of polysilicon, $SnO_2$, ITO, etc. and an $n^+$ diffusion layer 78 serving both as a drain and isolation region. Moreover, a surface of the gate electrode 77 is covered with an insulating layer 79. Further, the gate insulating film 76 is arranged uniformly on a surface of the epitaxial layer 73 except a portion corresponding to the source diffusion layer 74 of respective MOSSIT 71.

In the MOSSIT 71 shown in FIGS. 8A and 8B, when use is made of the $n^-$ epitaxial layer 73, a concentration and a thickness of the expitaxial layer 73 are made to $1 \times 10^{13}$ cm$^{-3}$ and 8 $\mu$m respectively, and the depth $x_j$ of the source diffusion layer 74 and the drain and isolating layer 78 are made to the same value preferably below 0.2 $\mu$m. Moreover, the diameter $\phi_1$ of the source diffusion layer 74 is preferably made smaller than 1.0 $\mu$m, the diameter $\phi_2$ of the gate electrode 77 has the value from 2.0 to 6.0 $\mu$m, and a thickness of the gate insulating layer 76 has a value from 200 to 1,000 Å.

Figure 8C:
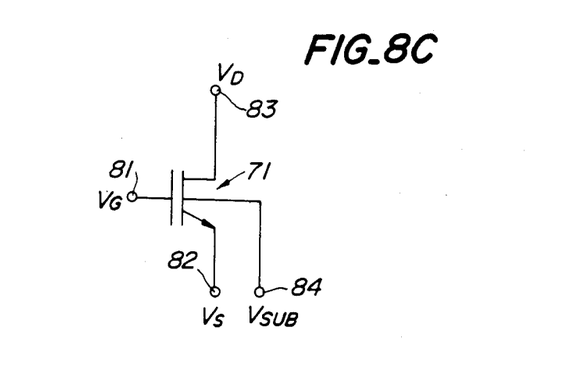
Figure 9A:
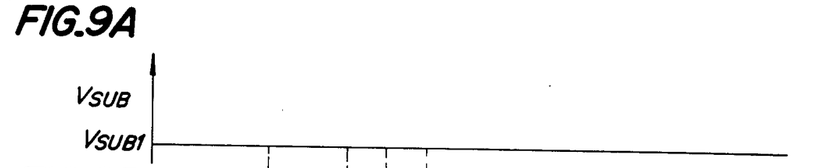
FIGS. 9A to 9D and FIGS. 10A to 10D are schematic views for explaining the operation of the SIT shown in FIG. 8A to 8C.
Figure 9B:
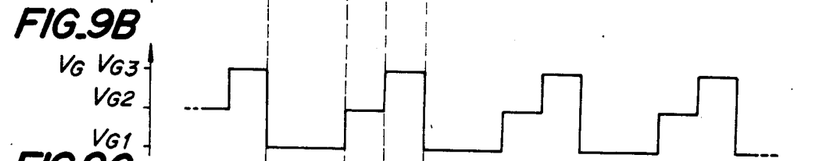
Figure 9C:
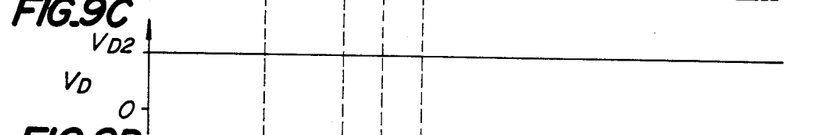
Figure 9D:
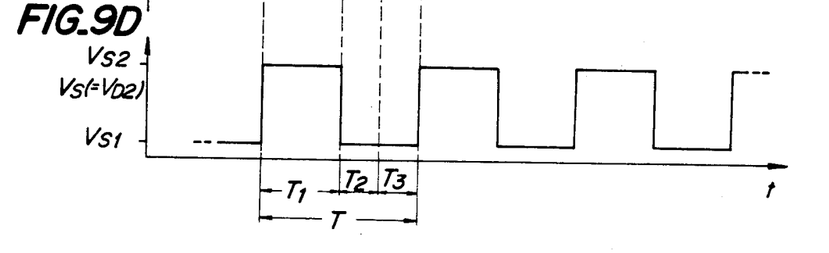

FIG. 8C shows an equivalent circuit of the MOSSIT 71. In the embodiment shown in FIG. 8C, the gate voltage $V_G$ is applied to the gate electrode 77 through a gate terminal 81, and the source voltage $V_S$ is applied to the source electrode 75 through a source terminal 82. Further, the drain voltage $V_D$ is applied to a drain terminal 83 connected to the drain and isolating diffusion layer 78, and a substrate voltage $V_{SUB}$ is applied to the substrate 72 through a substrate terminal 84.

Now, the operation of the above-mentioned MOSSIT 71 will be explained with reference to FIGS. 9A to 9D and FIGS. 10A to 10D. FIGS. 9A to 9D show waveforms of the substrate voltage $V_{SUB}$, the gate voltage $V_G$, the drain voltage $V_D$ and the source voltage $V_S$, wherein the horizontal axis denotes the time t and the vertical axis represents a voltage value. A light receiving unit period T of the MOSSIT 71 is the sum of the storing time $T_1$, readout time $T_2$ and reset time $T_3$. During the light receiving period T, a constant voltage $V_{D2}(>0)$ is always applied to the drain terminal 83 as the drain voltage $V_D$, and an inverse bias voltage $V_{SUB1}$ (below the ground potential) is always applied to the substrate terminal 84 as substrate voltage $V_{SUB}$. Moreover, as to the gate voltage $V_G$ and the source voltage $V_S$, during the storing time $T_1$, the gate voltage $V_G$ is set to a storing gate voltage $V_{G1}$ ($<0$) and the source voltage $V_S$ is set to a voltage $V_{S2}$ ($=V_{D2}$) equal to the drain voltage $V_D$. During the readout time $T_2$, the gate voltage $V_G$ is set to a readout gate voltage $V_{G2}$ ($V_{G1}<V_{G2}<0$) and the source voltage $V_S$ is set to a ground voltage $V_{S1}$ ($<V_{S2}$). Further, during the reset time $T_3$, only the gate voltage $V_G$ is set to a reset gate voltage $V_{G3}$ ($>0$) and the source voltage $V_S$ is maintained at the ground voltage $V_{S1}$.

Figure 10A:
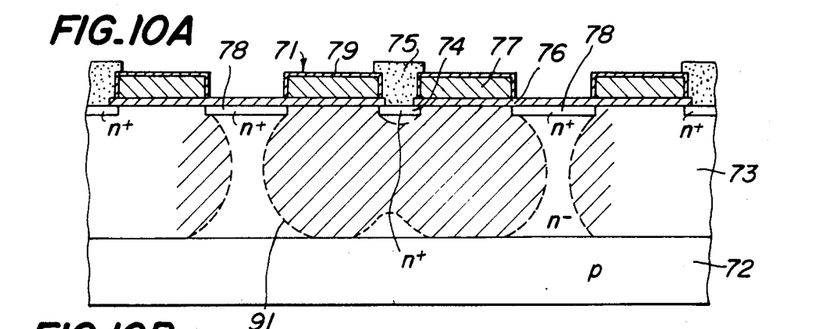
Figure 10B:
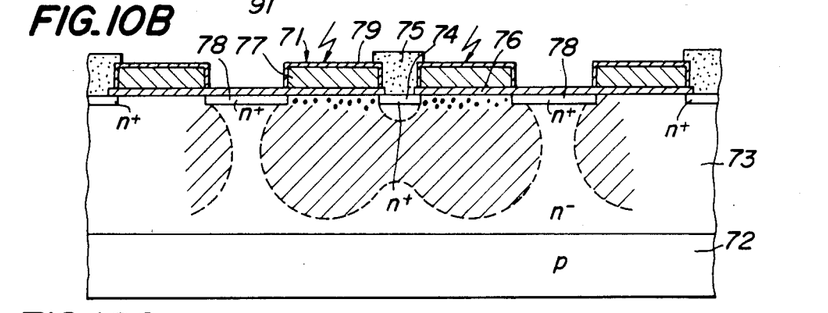

Just after the reset operation is effected, as shown in FIG. 10A, a depletion layer 91 extends largely in the substrate direction from a boundary between the gate insulating film 76 and the epitaxial layer 73. This state is maintained till the readout time $T_2$ is started if no light is made incident upon the gate electrode 77. However, if the light impinges upon the gate electrode 77, electron-hole pairs are generated in the depletion layer 91 and its neighbors and the thus generated holes 92 are stored in the surface of the epitaxial layer 73 just beneath the gate insulating film 76 as shown in FIG. 10B, so that the extension of the depletion layer 91 is made smaller and correspondingly the potential barrier with respect to electrons moving in the vertical direction becomes lower as compared with FIG. 10A.

Figure 10C:
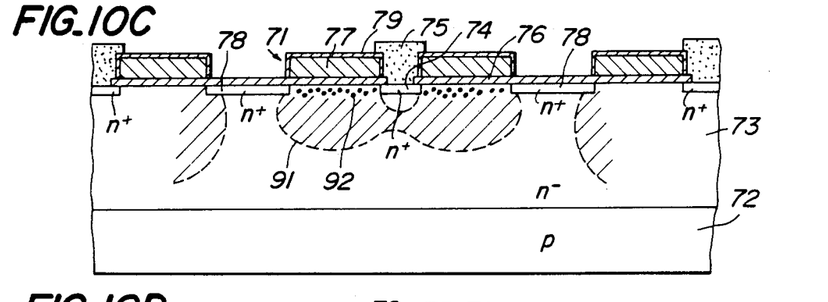

When the gate voltage $V_G$ is increased from $V_{G1}$ to $V_{G2}$ after a lapse of the storing time $T_1$, as shown in FIG. 10C, the potential barrier with respect to electrons is made much lower by an increased amount in the gate voltage $V_G$, and thus an amplified signal current flows between the source and drain. It has been experimentally found that this output signal current is approximately in proportion to an integrated amount of incident light during the storing time $T_1$.

Figure 10D:
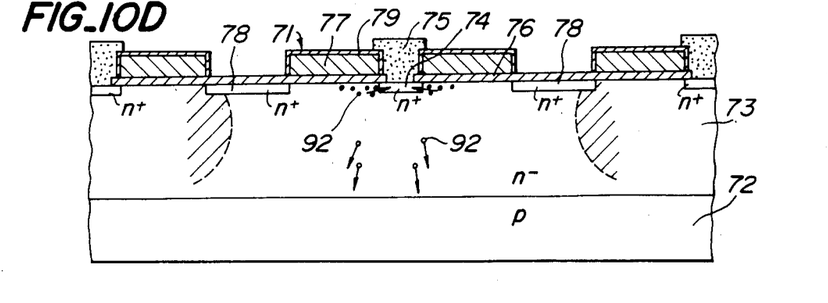

When the gate voltage $V_G$ is further increased from the $V_{G2}$ to $V_{G3}$ ($>V_{S1}$) after a lapse of the readout time $T_2$, the holes 92 stored in the surface of the epitaxial layer 73 just beneath the gate insulating film 76 flow away partly through the source diffusion layer 74 and the source electrode 75 and partly through the substrate 72. After that, the gate voltage $V_G$ is set to $V_{G1}$ and the source voltage $V_S$ becomes $V_{S2}$ after a lapse of the reset time $T_3$, so that the next light receiving period is started. It should be noted that a movement of the holes 92 stored just beneath the gate insulating film 76 into adjacent pixels is avoided by a high barrier with respect to holes moving in the lateral direction which is formed by the drain and isolating diffusion layer 78 to which the drain voltage $V_D$ is applied and the substrate 72 having a built-in potential due to the substrate voltage $V_{SUB}$ or that to which the inverse bias voltage is further applied.

In the MOSSIT 71 mentioned above, since the holes generated in the deep portion of the epitaxial layer 73 and also the holes generated by the light over the saturated amount of exposure flow into substrate 72, blooming and smear can hardly occur.

In still another embodiment of the solid state image sensor according to the invention, m×n MOSSITs illustrated in FIGS. 8A to 8C are arranged in a matrix manner and successive pixel signals are readout by the same circuit construction as shown in FIG. 5A. Also in the present embodiment, the light receiving device having MOSSITs and the peripheral circuit devices are formed on the same substrate.

Figure 11A:
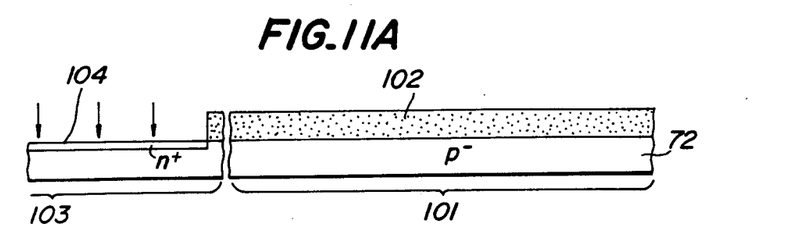
FIGS. 11A to 11J are schematic views showing a process of manufacturing the solid state image sensor illustrated in FIGS. 8A to 8C.

Hereinafter, successive steps for forming the light receiving device and the peripheral circuit devices will be explained with reference to FIGS. 11A to 11J. At first, as shown in FIG. 11A, a resist film 102 is formed on a surface of a light receiving device portion 101 of the p-type substrate 72, and a donor impurity such as arsenic or phosphorus is deposited in a region at which a well for a peripheral circuit device portion 103 is to be formed so as to form an n+ layer 104 for electrically isolating the well from the substrate 72. In this case, a deposition concentration of the donor impurity is set to a value from $1 \times 10^{16}$ to $1 \times 10^{17}$ cm$^{-3}$ after a final process is ended.

Figure 11B:
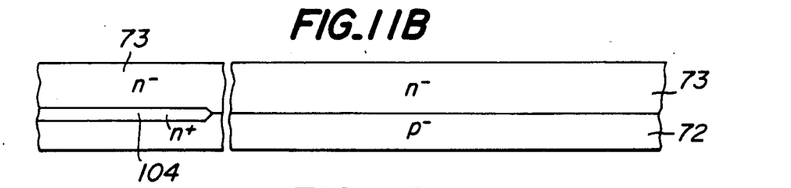

Then, an insulating film to which the donor impurity is deposited and the resist film 102 formed on the light receiving device portion 101 are removed, and an n$^-$ or an intrinsic epitaxial layer 73 is grown as shown in FIG. 11B.

Figure 11C:
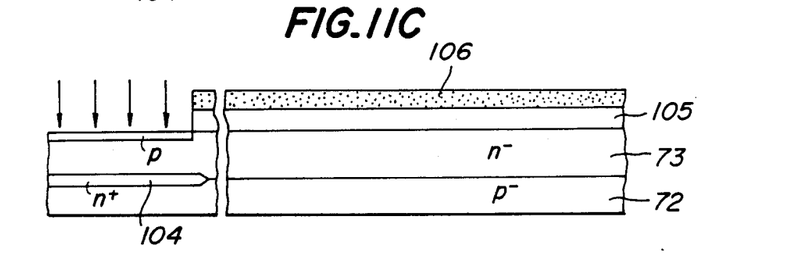
Figure 11D:
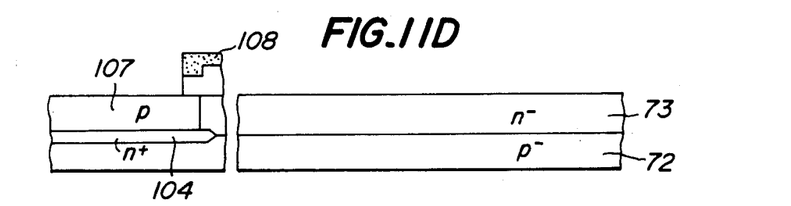
Figure 11E:
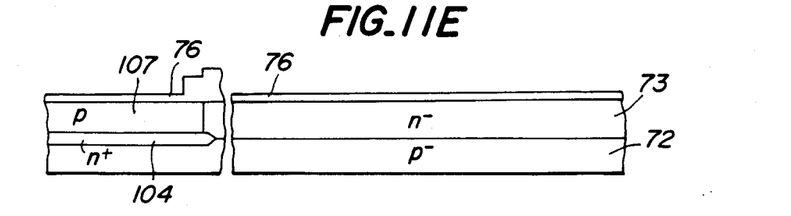

After that, as shown in FIG. 11C, a field insulating film 105 whose thickness is about 7,000 Å is uniformly formed on a surface of the epitaxial layer 73 by means of thermal oxidation, etc. After that, a resist film 106 is formed on a light receiving device portion 105 by means of photolithography and then an insulating film corresponding to a portion in which a well for the peripheral circuit device portion 104 is to be formed is etched away so as to deposit an impurity for a well such as boron such an extent that the concentration of this region becomes about $1 \times 10^{13}$ cm$^{-2}$. Then, the resist film 106 for the well formation is removed, and a p-type well 107 having a depth of about 5 $\mu$m is formed by the well drive-in as shown in FIG. 11D. Then, the insulating film arranged on the region on which the gate insulating film is to be formed is removed by an etching operation after a resist film 108 is formed on the other region by photolithography, and the gate insulating film 76 having a thickness of about 200 to 1,000 Å is formed as shown in FIG. 11E.

Figure 11F:
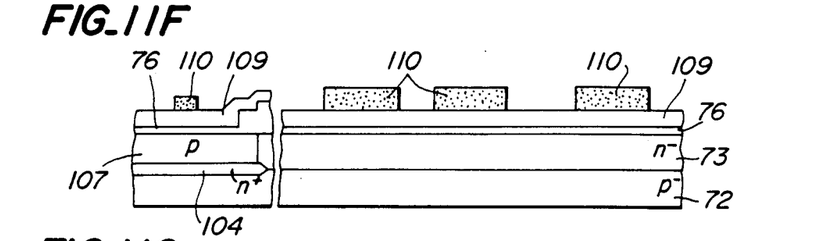
Figure 11G:
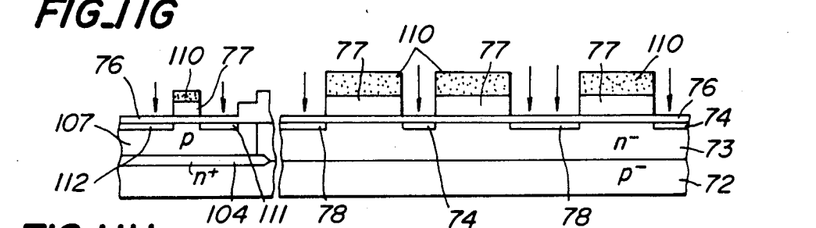

Next, as shown in FIG. 11F, an electrode film 109 having a thickness of about 500 to 3,000 Å is formed, and a resist film 110 for forming respective gate electrodes of the MOSSIT of the light receiving device and NMOSFET of the peripheral circuit devices is formed on the electrode film 109 by photolithography. After that, as shown in FIG. 11G, the electrode film 109 is removed by etching to form respective gate electrodes 77 of MOSSITs and NMOSFETs. Then, by utilizing the gate electrodes 77 as a mask, the n+ source diffusion layers 74 and the n+ drain and isolating diffusion layers 78 of MOSSITs and n+ source diffusion layers 111 and n+ drain diffusion layers 112 of NMOSFETs are formed in such a manner that an impurity such as arsenic or phosphorus is deposited by the ion injection method to such an extent that a concentration thereof becomes about $1 \times 10^{15}$ to $10 \times 10^{15}$ cm$^{-2}$.

Figure 11H:
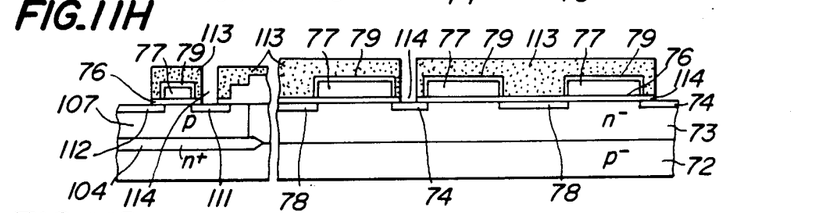
Figure 11I:
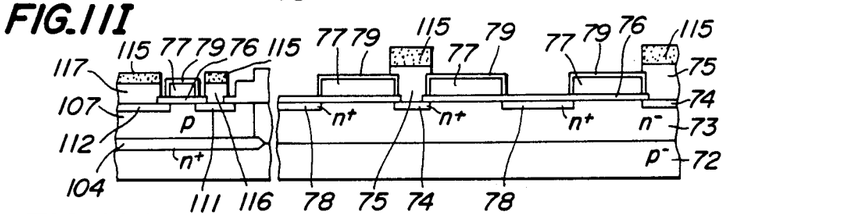
Figure 11J:
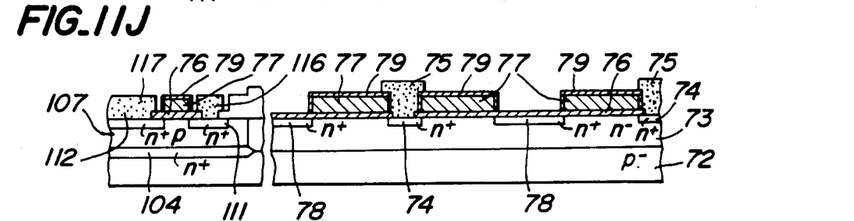

After that, the resist film 110 for use in the gate electrode formation is removed and the insulating film 79 is deposited on the surface of the gate electrode 77. Then, as shown in FIG. 11H, a resist film 113 is formed by photolithography, and is formed contact holes 114 are formed for use in the formation of the source electrodes and the drain and isolating electrodes of the light receiving device and the source electrodes and the drain electrodes of NMOSFETs of the peripheral circuit devices. Then, the resist film 113 for use in the contact hole formation removed, and an electrode film is formed for use in respective formations of the source electrode and the drain and isolating electrodes and the source and drain electrodes of NMOSFETs forming the peripheral circuit devices. After that, as shown in FIG. 11I, a resist film 115 is formed by photolithography, and the residual electrode film is removed by an etching operation to form the source electrodes 75 and the drain and isolating electrodes (not shown) of the light receiving device and source electrodes 116 and drain electrodes 117 of NMOSFETs consisting of the peripheral circuit devices. Then, the resist film 115 arranged on these electrodes is removed to form the light receiving device having MOSSITs and the peripheral circuit devices having NMOSFETs on the same substrate 72, as shown in FIG. 11J.

In this manner, as that described in the embodiment mentioned above, the light receiving device and the peripheral circuit devices can be formed on the same substrate in an easy and inexpensive manner by utilizing few masks, such as five or six.

The present invention is not limited to the embodiments mentioned above, but various modifications are possible. For example, in the MOSSIT 11 illustrated in FIGS. 2A to 2C, use is made of n$^-$ or intrinsic semiconductor material as the semiconductor substrate, but use may be made of a semiconductor having a complex layer construction such as n$^-$/n$^+$, intrinsic semiconductor/n$^+$ or p$^-$/n$^+$. Even in this case, the forming process is not so complicated because only an epitaxial step for depositing an n$^-$, intrinsic or p$^-$ semiconductor on the n$^+$ substrate is added to the steps shown in FIGS. 7A to 7H and the number of masks to be used is also five or six. Moreover, when use is made of the complex layer semiconductor, a parasitic drain resistor can be lowered as compared with the MOSSIT 11 illustrated in FIGS. 2A to 2C, and the isolation between pixels with respect to the holes can be certainly effected. Further, since the length of the potential barrier can be controlled in response to the thickness of the epitaxial layer, there can be realized a free process design and a free device design. Moreover, in this modified embodiment and the embodiments illustrated in FIGS. 2 to 7, the isolation may be realized by an insulating recess instead of a n+ diffusion layer. Further, in the MOSSIT 71 illustrated in FIGS. 8A to 8C, use is made of the p-type substrate 72, but it is possible to use an insulating substrate instead of the p-type substrate 72. Furthermore, in the solid state image sensor according to the invention, use is made of the n channel construction, but use may be made of a p channel construction. In this case, it is necessary to make the polarity of the voltage to be applied inverse. Moreover, in the solid state image sensor of source-drain selection type illustrated in FIG. 5A, the gate voltage $V_{\phi G}$ during the readout time shown in FIGS. 6A to 6C can be made the same level as that during the storing time. Moreover, since light charges can be stored even if the inverse selection transistors 45-1 to 45-n, it is possible to eliminate these inverse selection transistors. Further, in the solid state image sensor according to the invention, the type of the solid state image sensor is not limited to the source-gate selection type, but use may be made of a drain-gate selection type or a source-drain selection type so as to derive a video signal by effecting the raster scanning operation.

As clearly understood from the above, according to the invention, since the SITs consisting of respective pixels have the MOS gate construction having no gate diffusion layer, use may be made of the self alignment process necessary for integrating the source-drain construction with very few masks. Moreover, since this process can be preferably applied to the formation of the peripheral circuit devices, the solid state image sensor having high integration property can be obtained in an inexpensive manner. Further, since the gate electrode can be made thin, it is possible to obtain the solid state image sensor showing the high sensitivity for a range from a long wavelength to a short wavelength. Furthermore, according to the invention, it is possible to effect a reset operation of the light storing charges in an easy and positive manner as compared with the solid state image sensor having a gate diffusion layer, and the breakdown voltage between gate and source can be made higher. In addition, possible variations in the device's characteristics can be minimized.

What is claimed is:

1. A solid state image sensor comprising:
   a semiconductor substrate; and
   a plurality of pixels arranged in the semiconductor substrate in a matrix form, each of said pixels being formed by a static induction transistor having an insulated gate construction formed in a surface of semiconductor substrate, said static induction transistor including a source region on said surface, a gate adjacent said source on said surface, and a drain region on another surface of said substrate, and wherein a potential barrier is formed by an inversion layer between said source and drain regions due to a voltage applied to said gate, said potential barrier restricting flow of electrons flowing substantially perpendicular with said surface of said semiconductor substrate between said source and drain regions, said potential barrier being modulated in response to light incident upon said static induction transistor.

2. A solid state image sensor according to claim 1, wherein said static induction transistor comprises a source electrode region of one conductivity type formed in a first surface of said semiconductor substrate, a gate insulating film formed on said first surface of said semiconductor substrate and which surrounds said source electrode region, and a gate electrode formed on said gate insulating film.

3. A solid state image sensor according to claim 2, wherein said static induction transistor further comprises a drain electrode region formed on a second surface of said semiconductor substrate.

4. A solid state image sensor according to claim 3, wherein said semiconductor substrate is formed by an $n^-$ semiconductor material.

5. A solid state image sensor according to claim 3, wherein said semiconductor substrate is formed by an intrinsic semiconductor material.

6. A solid state image sensor according to claim 3, wherein said static induction transistor further comprises an isolation region formed around said gate insulating film for isolating each pixel from adjacent pixels.

7. A solid state image sensor according to claim 6, wherein said isolation region is formed by a semiconductor region of said one conductivity type formed in said first surface of the semiconductor substrate.

8. A solid state image sensor according to claim 7, wherein each semiconductor region formed of said one conductivity type is a diffusion region.

9. A solid state image sensor according to claim 2, wherein said static induction transistor further comprises a drain electrode region of said one conductivity type which is formed in said first surface of said semiconductor substrate and which surrounds the gate insulating film.

10. A solid state image sensor according to claim 9, wherein said semiconductor substrate comprises a first semiconductor layer and a second semiconductor layer of said one conductivity type applied on the first semiconductor layer.

11. A solid state image sensor according to claim 10, wherein said first and second semiconductor layers are formed by $n^+$ and $n^-$ layers, respectively.

12. A solid state image sensor according to claim 10, wherein said first and second semiconductor layers are formed by $n^+$ and intrinsic layers, respectively.

13. A solid state image sensor according to claim 10, wherein said first and second semiconductor layers are formed by $n^+$ and $p^-$ layers, respectively.

14. A solid state image sensor according to claim 1, wherein said gate insulating film is formed by an oxide of a semiconductor material forming the semiconductor substrate.

15. A solid state image sensor according to claim 1, wherein said gate electrode is formed by material selected from a group consisting of polysilicon, $SnO_2$ and ITO.

16. A solid state image sensor according to claim 2, wherein the static induction transistor further comprises an insulating layer covering the gate electrode.

17. A solid state image sensor according to claim 2, wherein said source electrode region is formed in said first surface of said semiconductor substrate, and wherein said gate insulating film is utilized as a mask so as to form a self-alignment construction.

* * * * *